United States Patent [19]

Samachisa et al.

[11] Patent Number: 5,272,669
[45] Date of Patent: Dec. 21, 1993

[54] METHOD AND STRUCTURE FOR PROGRAMMING FLOATING GATE MEMORY CELLS

[75] Inventors: Gheorghe Samachisa, San Jose; Yupin K. Fong, Fremont, both of Calif.

[73] Assignee: Sundisk Corporation, Santa Clara, Calif.

[21] Appl. No.: 658,098

[22] Filed: Feb. 20, 1991

[51] Int. Cl.$^5$ .................. G11C 16/02; G11C 11/40
[52] U.S. Cl. .............................. 365/185; 365/218; 365/900
[58] Field of Search ............... 365/185, 218, 900; 357/23.5

[56] References Cited

U.S. PATENT DOCUMENTS

| | | |
|---|---|---|
| 4,328,565 | 5/1982 | Harari . |
| 4,531,203 | 7/1985 | Masuoka et al. . |
| 4,561,044 | 12/1985 | Kuo et al. . |
| 4,639,893 | 1/1987 | Eitan . |
| 4,797,856 | 1/1989 | Lee et al. . |
| 4,996,571 | 2/1991 | Kume et al. ..................... 365/185 |
| 5,077,691 | 12/1991 | Haddad et al. .................. 365/900 |
| 5,097,444 | 3/1992 | Fong ................................ 365/185 |
| 5,122,985 | 6/1992 | Santin ............................. 365/185 |
| 5,132,935 | 7/1992 | Ashmore ......................... 365/218 |

OTHER PUBLICATIONS

"An 8K EEPROM Using the SIMOS Storage Cell", by Burkhard Giebel, *IEEE Journal of Solid-State Circuits*, vol. SC-15, No. 3, Jun. 1980, pp. 311-315.
"A 128K Flash EEPROM Using Double-Polysilicon Technology", by Gheorghe Samachisa et al., *IEEE Journal of Solid-State Circuits*, vol. SC-22, No. 5, Oct. 1987, pp. 676-683.
"EPROM Cell with High Gate Injection Efficiency", by M. Kamiya et al., *Semiconductor Dept., Daini-Seikosha Co., Ltd., Matsudo, Japan*, 1982 IEEE, pp. 741-744.
"An In-System Reprogrammable 32K×8 CMOS Flash Memory", by Virgil Niles Kynett et al., *IEEE Journal of Solid-State Circuits*, vol. 23, No. 5, Oct. 1988, pp. 1157-1163.
"A 5-Volt Contactless Array 256KBit Flash EEPROM Technology", by M. Gill et al., *Texas Instruments Inc.*, 1988 IEEE, pp. 428-431.
"A 5 Volt High Density Poly-Poly Erase Flash EPROM Cell", by R. Kazerounian et al., *Waferscale Integration, Inc.*, 1988 IEEE, pp. 436-439.
"New Device Technologies for 5V-Only 4Mb EEPROM with NAND Structure Cell", by M. Momodomi et al., *ULSI Research Center*, 1988 IEEE, pp. 412-415.

(List continued on next page.)

*Primary Examiner*—John S. Heyman
*Attorney, Agent, or Firm*—Steven F. Caserza

[57] ABSTRACT

A novel method and structure are taught for narrowing the distribution of charge on the floating gates after electrical erasure of a population of cells. This allows faster programming following erasure. An additional recovery step is performed after erasure and prior to programming. The recovery step serves to adjust the state of erasure of the cells such that the distribution of the amount of erasure of each cell in the population of cells is reduced. This is accomplished in order to cause those cells which would have a relatively high floating gate voltage $V_{FG}$ after erasure to be recovered such that their floating gate voltage is made less positive, while having little or no effect on the floating gate voltage of cells which are not overerased. The recovery is performed either as a final step in the erase operation, a separate recovery step independent of the erase or program operations, or as a preliminary step during the programming operation. Recovery can be performed on all memory cells simultaneously, blocks or groups of memory cells in sequence, or individual memory cells in sequence. The recovery step is performed utilizing a low control gate voltage, which voltage is approximately equal to or slightly greater than the threshold voltage of the select transistor, which generates a relatively high floating gate current for over-erased cells, causing them to be significantly less over-erased.

26 Claims, 5 Drawing Sheets

OTHER PUBLICATIONS

"A Flash-Erase EEPROM Cell with an Asymmetric Source and Drain Structure", by H. Kume et al., *Technical Digest of the IEEE International Electron Devices Meeting*, Dec. 1987, pp. 560-563, IEEE.

"Triple Level Polysilicon EEPROM with Single Transistor Per Bit", by J. Kupec et al., *IEDM Technical Digest*, 1980, IEEE, pp. 602-606.

"A 256K Flash EEPROM Using Triple Polysilicon Technology", by F. Masuoka et al., *Digest of Technical Papers, IEEE International Solid-State Circuits Conf.* Feb. 1985, pp. 168-169 & 335.

"An In-System Reprogrammable 256K CMOS Flash Memory", by V. N. Kynett et al., *Digest of Technical Papers, IEEE International Solid-State Circuits Conf.*, Feb. 1988, pp. 132-133.

"A New EPROM Cell with a Side-Wall Floating Gate for High-Density and High-Performance Device", by Y. Mizutani et al., *IEDM Technical Digest*, 1985, pp. 635-638.

"A Novel High-Speed, 5-Volt Programming EPROM Structure with Source-Side Injection", by A. T. Wu et al., *1986 IEDM Technical Digest*, pp. 584-587.

"A Programmable 256K CMOS EPROM with On-Chip Test Circuits", by S. Tanaka et al., *1984 ISSCC Digest of Technical Papers*, pp. 148-149.

"Hi-CMOS III Technology", by S. Meguro et al., *1984 IEDM Technical Digest*, pp. 59-62.

"A Very Small Schottky Barrier Diode with Self-Aligned Guard Ring for VLSI Application", by S. Kim, *1979 IEDM Technical Digest*, pp. 49-53.

"Endurance Model for Textured-Poly Floating Gate Memories", by H. A. R. Wegener, *Technical Digest of the IEEE International Electron Device Meeting*, Dec. 1984 pp. 480-483, IEDM.

"An Experimental Large-Capacity Semiconductor File Memory Using 16-Levels/Cell Storage", by M. Horiguchi et al., *IEEE Journal of Solid-State Circuits*, vol. 23, No. 1, Feb. 1988, pp. 27-33.

"An Experimental 2-Bit/Cell Storage DRAM for Macro Cell or Memory-on-Logic Application", by T. Furuyama et al., *IEEE Custom Integrated Circuits Conf.*, May 1988, pp. 4.4.1-4.4.4.

METHOD AND STRUCTURE FOR PROGRAMMING FLOATING GATE MEMORY CELLS

This invention pertains to a new programming method for floating gate memory cells which reduces the effect of overerase on programming speed and reduces cell programming speed distribution after electrical erasure.

BACKGROUND OF THE INVENTION

Prior art methods for programming a floating gate memory cell, such as are used in EPROM, EEPROM, and flash EEPROM devices, utilize hot electron injection from the channel to the floating gate. During such programming, both the control gate voltage and the drain voltage are at high potential in order to create hot electrons in the channel and inject the hot electrons into floating gate.

When prior art programming methods are used, after electrically erasing the cells, to program a floating gate memory cell, a programming speed degradation is seen. The degradation represents a slowdown of programming after electrically erasing the cells. The degree of degradation depends on the degree the cells are erased, as shown by the data in Table 1.

TABLE 1

| ERASE VOLT-AGE | CELL $V_T$ and $I_D$ | PROGRAMMING TIME | | | | | | |
|---|---|---|---|---|---|---|---|---|
| | | 0 | 5 µs | 10 µs | 20 µs | 30 µs | 50 µs | 70 µs |
| 13V | $V_T(V)$ | 2.36 | 7.10 | 8.42 | 9.33 | | | |
| | $I_D(\mu A)$ | 24.80 | 0 | 0 | 0 | | | |
| 15V | $V_T(V)$ | 2.01 | 2.27 | 7.89 | 9.09 | | | |
| | $I_D(\mu A)$ | 45.10 | 29.09 | 0 | 0 | | | |
| 17V | $V_T(V)$ | 1.80 | 1.81 | 1.84 | 2.10 | 9.65 | | |
| | $I_D(\mu A)$ | 56.36 | 50.06 | 44.58 | 39.43 | 0 | | |
| 19V | $V_T(V)$ | 1.68 | 1.69 | 1.69 | 1.70 | 1.71 | 1.76 | 8.59 |
| | $I_D(\mu A)$ | 61.38 | 61.14 | 60.96 | 60.46 | 60.02 | 58.11 | 0 |

Degradation of programming speed is seen in both types of cells used in flash EEPROM technology: (1) The split gate cell as described in U.S. patent application Ser. No. 204,175 filed by Harari and entitled, "Highly Compact EPROM and Flash EEPROM Devices" and (2) The single transistor cell or EPROM-like cell as described by Kume et al. in "A Flash-Erase EEPROM Cell with an Asymmetric Source and Drain Structure", 560IEDM87, IEEE, 1987. The physical phenomena behind this degradation is the decrease of maximum value of channel longitudinal electrical field, for the same programming conditions, after electrically erasing the cell. The degradation is more pronounced in the split gate cell because of greater sensitivity of the longitudinal electrical field to the potential of the floating gate after electrical erasure.

To better understand the cause of programming speed degradation after electrically erasing a split gate cell, FIGS. 1a and 1b show the status of the floating gate after erase. Cell 100a in FIG. 1a is moderately erased and cell 100b in FIG. 1b is strongly erased, which is often referred to as "overerased." In moderately erased cell 100a (FIG. 1a) at the end of erasure floating gate 101a is neutral or has only a slight positive charge. In overerased cell 100b (FIG. 1b) floating gate 101b is depleted of electrons at the end of erasure and thus the floating gate is positively charged. This positive charge increases the floating gate potential by an amount equal to $Q/C_{TOT}$ where Q is the total positive charge on floating gate 101b and $C_{TOT}$ is the total coupling capacitances to the floating gate $C_{TOT}=C_1+C_2+C_D$ making the floating gate more positive compared with moderately erased cell 101a (FIG. 1a).

The conductance of channel 102b under floating gate 101b for overerased cell 100b is greater than the conductance of moderately erased cell 101a for the same programming conditions, i.e., the same control gate voltage $V_{CG}$ and drain voltage VD during programming. Depending on the degree of overerasure, the conductance of channel 102b under floating gate 101b becomes comparable or even higher than the conductance of the channel of select transistor 103b under programming biasing conditions. Because of this high conductance of channel 102b under the floating gate 101b, the maximum electrical field in channel 102b for overerased cell 100b in FIG. 1b is lower than the maximum electrical field in channel 102a of moderately erased cell 100a in FIG. 1a, and thus, for the same programming conditions (e.g., control gate voltage $V_{CG}=12$ V, drain voltage $V_D=7$ V), moderately erased cell 100a of FIG. 1a programs faster than overerased cell 100b of FIG. 1b. This means that overerased cells program slower.

The conclusion that overerased cells program slower is supported also by considering floating gate current $I_{FG}$ vs. floating gate voltage $V_{FG}$ characteristic shown in FIG. 2. The curve of FIG. 2 is taken from a test cell identical in geometry with a floating gate cell of interest, but where the floating gate is electrically contacted to allow measurements to be made. The $I_{FG}$ vs $V_{FG}$ characteristic in FIG. 2 is the well-known bell gate current characteristic of a MOS transistor. If in a moderately erased cell 100a the floating gate potential at the beginning of programming is approximately $V_{FGA}$ (see FIG. 2), the floating gate potential of overerased cell 100b, $V_{FGB}$, is greater than $V_{FGA}$ by the amount $Q/C_{TOT}$. Depending on the amount of overerasure, the floating gate current in overerased cells can be very small at the beginning of programming (corresponding to $V \geq V_{FGB}$ in FIG. 2). Therefore, cells with $V_{FG} \geq V_{FGB}$ program very slowly because the floating gate current at the beginning of programming is very small.

From FIG. 2 it is clear that, for fast programming, the erase has to be controlled such that after erase the floating gate potential under programming biasing conditions is approximately $V_{FGA}$, where the floating gate current during programming is relatively high. Unfortunately electrical erase is not a self-limiting mechanism, i.e., the erase continues (with a different speed) as long as the erase voltage is applied. This means that in order to control the amount of cell erasure, the erase time and erase voltage have to be controlled.

Attempts have made in the prior art to control the amount of cell erasure. For example, "A Flash-Erase EEPROM Cell with an Asymmetric Source and Drain Structure," 560-IEDM87, IEEE, 1987 describes an EEPROM Cell having asymmetrical source and drain regions in an attempt to provide a high degree of control during erase. U.S. Pat. No. 4,794,856, issued Jan. 10, 1989, describes a self-limiting technique for preventing overerasure wherein a drain voltage is fed back to a floating gate to reduce the electric field across the tunnel oxide. However, even using techniques known in the prior art in order to erase a plurality of cells having non-uniform programming levels and erase characteristics, it is difficult to ensure a narrow distribution of cell characteristics or threshold voltage after erasure. Furthermore, each cell's erase characteristics change with programming/erase cycling due to electron trapping into oxide through which erase is performed. This distribution in erase characteristics of a population of cells, and changes in the distribution with the number of program/erase cycles, makes more difficult the control of the amount of cell erasure. Even using sophisticated methods to control erasing, there will be a distribution of the amount of erasure among cells, and as a consequence there will be a distribution in programming speed after electrically erasing the cells.

An "8k EEPROM using the SIMOS storage cell", By Burkhard Giebel, IEEE Journal of Solid-State Circuits, Vol. SC-15, No. 3, June 1980, pps. 311-315, describes a floating gate EEPROM device which programs by channel hot electron injection and is electrically erased through Fowler-Nordheim tunneling between the floating gates and an auxiliary N+ junction. Each cell includes a single polycrystalline silicon MOS transistor in series with a double polycrystalline silicon floating gate memory transistor. The single polycrystalline silicon MOS transistor serves as a select transistor in order to prevent leakage in overerased cells. Overerasure slows programming. To speed programming, Giebel describes a two-step programming method. In the first step, the control gate is held at 15 volts and in the second step the control gate is held at 25 volts. In both steps the gate of the select transistor is held high at 20 volts. The Giebel structure does not utilize a split gate cell, and the presence of N+ junctions between Giebel's memory transistor and select transistor causes the device to have an $I_{FG}$ versus $V_{FG}$ characteristic which does not include a hump $L_2$ as shown in FIG. 3 for a split gate cell, but rather is the bell-shaped characteristic depicted in FIG. 2. Thus, the more a Giebel cell is overerased, the smaller the floating gate current is during programming, in contrast to the case with split gate cells having the characteristic depicted in FIG. 3, in which greater amounts of overerasure yields greater amounts of floating gate current during programming, in certain programming conditions described in this invention.

SUMMARY OF THE INVENTION

In accordance with the teachings of this invention, a novel method and structure are taught for narrowing the distribution of charge on the floating gates after erasure of a population split gate of cells. This allows faster programming following erasure. In accordance with the teachings of this invention, rather than attempting to limit erasure, as has been attempted with marginal results in the prior art, the teachings of this invention approach this problem from a different point of view. In accordance with the teachings of this invention, an additional recovery step is performed after erasure and prior to programming, during which a moderate voltage is applied to the control gate of a split gate cell, which voltage is approximately equal to or slightly greater than the threshold voltage of the select transistor. The recovery step serves to adjust the state of erasure of the cells such that the distribution of the amount of erasure of each cell in the population of cells is reduced. This is accomplished in order to cause those cells which would have a relatively high floating gate voltage $V_{FG}$ after erasure to be recovered such that their floating gate voltage is made less positive, while having little or no effect on the floating gate voltage of cells which are not overerased.

In one embodiment of this invention, this recovery step is performed either as a final step in the erase operation, a separate recovery step independent of the erase or program operations, or as a preliminary step during the programming operation. Recovery can be performed on all memory cells simultaneously, blocks or groups of memory cells in sequence, or individual memory cells in sequence.

In accordance with the teachings of this invention, recovery is, in effect, a programming operation performed at a low control gate voltage. This is in contrast to the use of a high control gate voltage during a programming step, and which is known in the prior art. By utilizing a low control gate voltage during the recovery operation, a relatively high floating gate current is generated for overerased cells, causing them to become significantly less overerased. At the same time, with a low control gate voltage during the recovery step, cells which are not overerased are substantially not affected due to their relatively low floating gate current under these conditions.

The teachings of this invention are equally applicable to multi-state memory cells in which one of more than two possible memory states is stored in a given cell.

In accordance with one embodiment of this invention, a positive voltage is coupled to the floating gate (e.g., via a third gate) during recovery in order to enhance the recovery operation.

DETAILED DESCRIPTION

Figure 1A:
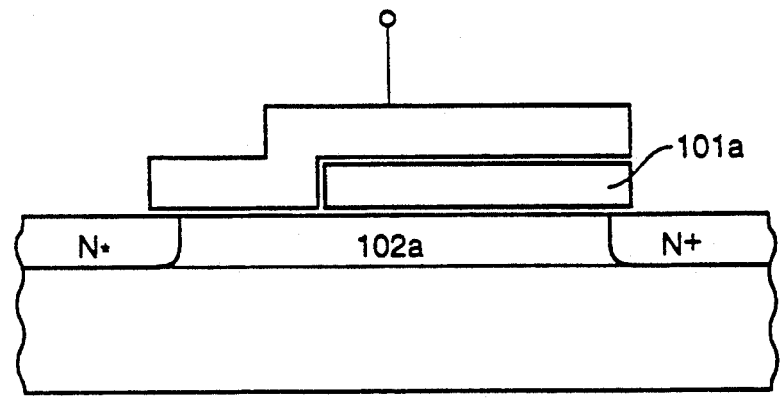
FIG. 1a is a cross-sectional view of a typical prior art EEPROM cell, after erasure.
Figure 1B:
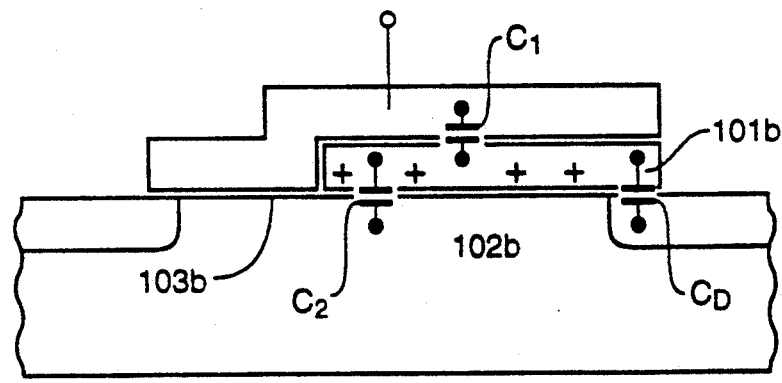
FIG. 1b is a cross-sectional view of a typical prior art EEPROM cell, which is overerased.
Figure 2:
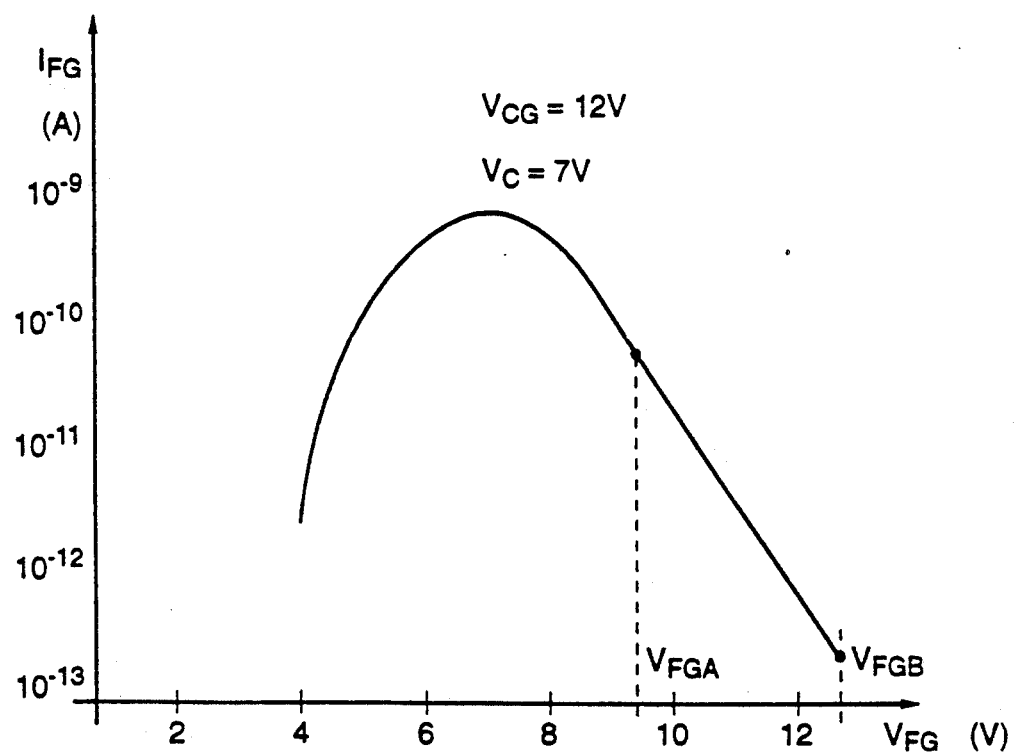
FIG. 2 is an $I_{FG}$ vs. $V_{FG}$ characteristic curve of a typical floating gate cell.
Figure 3:
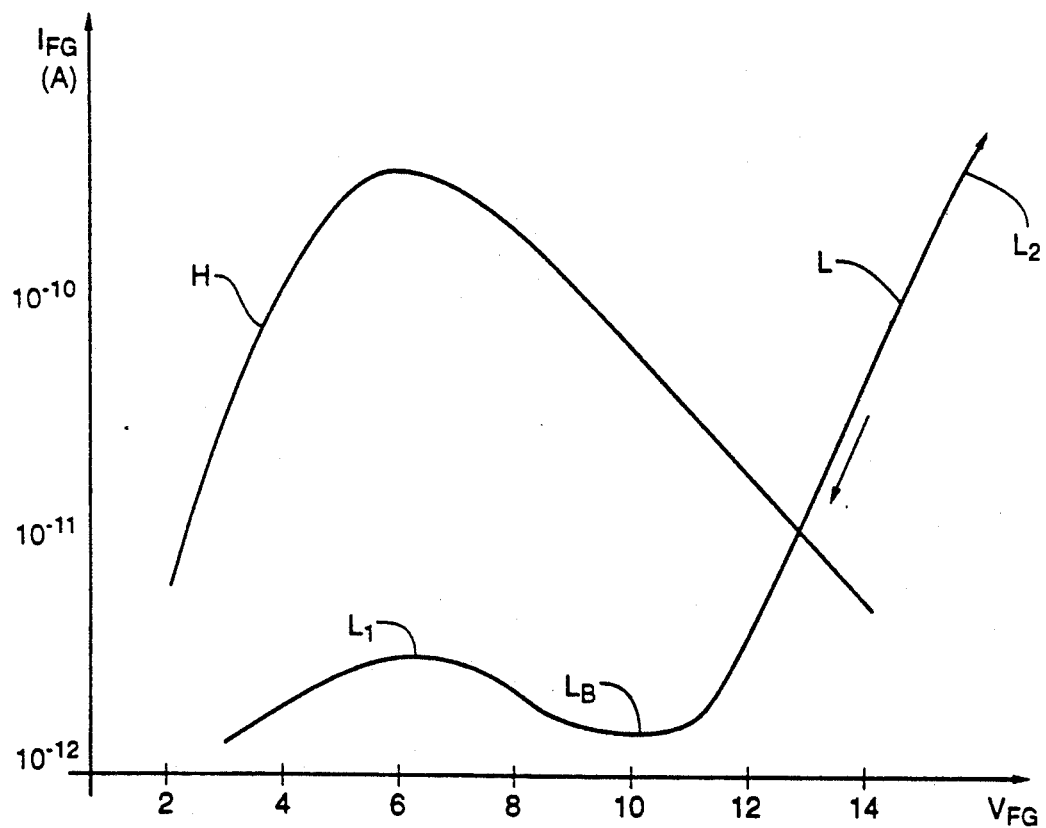
FIG. 3 depicts the $I_{FG}$ vs. $V_{FG}$ characteristic of a typical split gate floating gate cell for high and low values of control gate voltage.

In accordance with the teachings of this invention, a novel method improves programming speed of overerased cells and as a consequence reduces the nonuniformity of programming speed in a population of cells with a wide distribution in their amounts of erasure. A wide distribution in the amount of erasure of a population of cells translates into a wide distribution in floating gate memory cells at the beginning of programming. In accordance with the teachings of this invention, it is possible to make cells with floating gate potential (after erasure) at $V_{FGB}$ or above (FIG. 2) to program as fast as cells with floating gate potential around $V_{FGA}$ (at the beginning of programming). This is shown in FIG. 3 where floating gate current $I_{FG}$ versus floating gate voltage $V_{FG}$ in a test cell is plotted for different values of the control gate voltage, $V_{CG}$. The drain voltage is maintained constant at $V_D=7$ V, the value used during programming.

Curve L of FIG. 3 shows that for low control gate voltage (e.g. approximately 1V to 4V) the $I_{FG}$ vs. $V_{FG}$ characteristics presents two humps. The first hump ($L_1$) at a relatively low floating gate voltage is the well known bell-shaped gate current characteristic of a MOS transistor. The second hump ($L_2$) starts at a higher floating gate voltage, and the increase in floating gate current continues with increasing floating gate voltage. Due to the presence of this second hump $L_2$ in the $I_{FG}$ vs. $V_{FG}$ characteristic, a relatively large floating gate current is flowing through the cell at relatively high floating gate voltage. As shown by curve H, in the same floating gate voltage region only a very small gate current flows through the cell if a high control gate voltage (e.g. 12 volts) is applied to the cell. It is this high control gate voltage which is used during programming and thus it is seen that, in the prior art, a higher $V_{FG}$ at the beginning of programming is detrimental to programming speed.

The explanation for the second hump $L_2$ in the $I_{FG}$ vs. $V_{FG}$ curve of FIG. 3 characteristic is relatively simple. For a given drain voltage, keeping constant the control gate voltage at low potential and increasing the floating gate voltage, the electric field into the channel under the control gate to floating gate gap will increase with $V_{FG}$ (The electric field into the channel under the gate is small). In this electric field the electrons acquire sufficient energy to become hot electrons. The existence of hot electrons in the channel and a high potential on the floating gate generates the gate current and the second hump in $I_{FG}$ vs. $V_{FG}$ characteristic.

FG In accordance with the teachings of this invention, the second hump in the $I_{FG}$ vs. $V_{FG}$ characteristic is used to advantage to speed up programming in overerased cells and also to improve programming uniformity in a population of erased cells.

According to the teachings of this invention, erasure and re-programming of erased cells is performed in three steps.

1. Erasing Floating Gate Memory Cells

Erasure is performed in any convenient manner, such as is well known in the prior art: Fowler-Nordheim tunneling of electrons from the floating gate to the drain electrode through a thin erase oxide as described in "A 128 K Flash EEPROM Using a Double Polysilicon Technology," IEEE Journal of Solid-State Circuits, Vol. SC-22, No. 5, Oct. 1987, pp. 676-683; Fowler-Nordheim tunneling of electrons from the floating gate to the source electrode through a thin erase oxide as described in "A Flash Erase EEPROM Cell with an Asymmetric Source and Drain Structure," 560IEDM 87, IEEE, 1987; Fowler-Nordheim tunneling of electrons from the floating gate to an erase polycrystalline silicon line through a thick interpoly oxide as described in the aforementioned U.S. Pat. No. application Ser. No. 204,175.

2. Recovery of Overerased Cells

Recovery is a programming operation at low control gate voltage. The drain voltage is kept at relatively high voltage, the source is held low, and the erase gate may receive either a high or low voltage. During recover, the second hump $L_2$ in the low control gate voltage $I_{FG}$ vs. $V_{FG}$ characteristic curve L of FIG. 3 is used. Only overerased cells will be practically affected during this recovery step because only overerased cells have sufficiently high floating gate potential $V_{FG}$ to cause significant floating gate current $I_{FG}$.

The floating gates in overerased cells are charged with electrons via hot electron injection from the channel, and the potential of the floating gate in those overerased cells decrease quite rapidly due to high floating gate current. At the end of this recovery step the floating gate potential in overerased cells is near the bottom point $L_B$ of the second hump $L_2$ of FIG. 3. Recovery has the effect of altering the charge on the floating gates of the overerased cells to a lower value, so that they are now only slightly overerased. The distribution of floating gate potentials among the population of the erased floating gate memory cells has thus been tightened considerably as compared with the distribution existing after erasure step 1.

In an alternative embodiment of this invention, recovery is performed utilizing a drain voltage less than that used during programming, in order to minimize the drain hot carrier injection during recovery caused by the first hump L1 in $I_{FG}$ vs. $V_{FG}$ characteristics in FIG. 3.

3. Programming with High Control Gate Voltage

This step is the well known programming operation of floating gate devices using channel hot electron injection mechanisms for programming as in prior art flash EEPROM cells. During such programming operation, both the control gate voltage and drain voltage are at high potential (e.g., 12 V and 7 V, respectively). In accordance with the teachings of this invention, this step follows the recovery step and all cells, including both moderately erased cells and previously overerased cells, program fast.

The duration of the recovery step is not critical. A longer duration recovery is of greater benefit, but the duration of the recovery step will be limited by the need to keep a short total erase/programming time, particularly when recovery is performed as the initial part of a programming operation. In one embodiment of this invention, recovery is performed as the final step in the erasure operation, rather than as a preliminary step in the reprogramming operation. In this embodiment, the duration of the recovery step can be increased to ensure greater reduction in floating gate voltage, since erasure time is generally viewed as less critical than programming time. In an alternative embodiment, recovery is performed both as a final step in the erasure process, and as an initial step in the programming operation. In this embodiment, the duration for performing recovery as part of the erasure operation can be set to the same or a different value than the duration for which recovery is performed as the preliminary step of a reprogramming operation.

The value of the control gate voltage during recovery is not critical. Good results have been obtained with $V_{CG} = V_T + .5$ V to $V_T + 2.0$ V, where $V_T$ is the select transistor threshold voltage.

Table 2 shows experimental data obtained from a population of 2300 cells showing the efficiency of the programming method of this invention. Of interest, while after 5 microseconds of "programming" in accordance with the present invention (the recovery step) all cells are considered programming failures since no programming has occurred after 10 microseconds of "programming" (i.e. 5 microseconds of recovery and 5 microseconds of programming), no failures are observed—a significant improvement as compared with a ten microsecond programming pulse of the prior art. In fact, in this device 10 microseconds of "programming" in accordance with the present invention yields results comparable to 40 microseconds of programming utilizing prior art methods.

TABLE 2

| Prior Art | Present Invention | |
|---|---|---|
| $V_{CG}$ = 12 Volts | Recovery: | $V_{CG}$ = 3 Volts |
| | | $V_D$ = 7 Volts |
| $V_D$ = 7 Volts | One Pulse: | = 5 μsec |
| | Programming: | $V_{CG}$ = 12 V |
| | | $V_D$ = 7 V |

| CUMULATIVE PROGRAMMING TIME (μs) | # OF FAILURES | CUMULATIVE RECOVERY/ PROGRAMMING TIME (μs) | # OF FAILURES |
|---|---|---|---|
| 5 | 198 | 5 | 2300 |
| 10 | 28 | 10 | 0 |
| 15 | 8 | | |
| 20 | 3 | | |
| 25 | 2 | | |
| 30 | 1 | | |
| 35 | 1 | | |
| 40 | 0 | | |

Three or more state EEPROM cells are also affected by this overerasure problem, but to a greater degree. Three state EEPROM cells are described, for example, in co-pending United States patent application Ser. No. 337,579 on an invention of Mehrotra et al. entitled "Multi-State EEPROM Read and Write Circuits and Techniques", and co-pending U.S. patent application Ser. No. 204,175 on an invention of Harari entitled "Highly Compact EPROM and Flash EEPROM Devices".

Figure 4A:
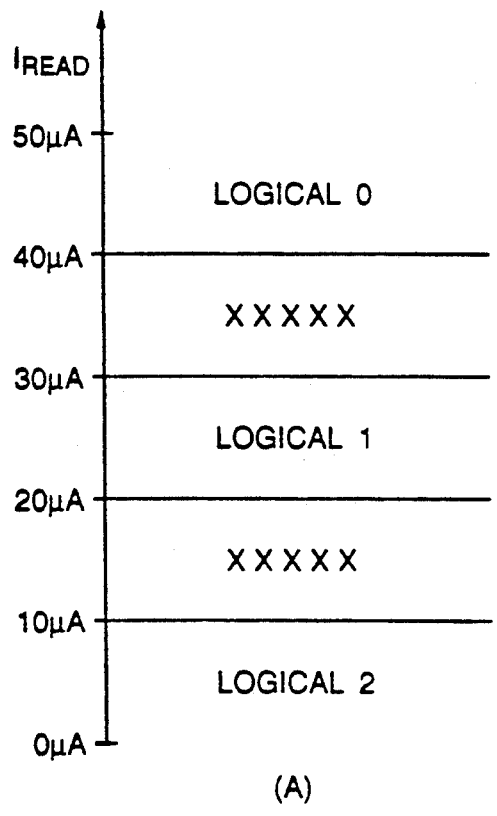
FIG. 4a depicts possible ranges for $I_{READ}$ for the different data states in a three state EEPROM cell.

In a three state EEPROM cell, the amount of read current ($I_{READ}$) determines which of the three possible data states (logical 0, 1, and 2) the cell is in as shown in FIG. 4a. Possible values for the three data states are, for example, $I_{READ} > 40$ μA (logical 0), 30 μA $> I_{READ} > 20$ μA (logical 1), and $I_{READ} < 10$ μA (logical 2). For a given read condition, e.g. $V_{CG} = 5V$ and $VD = 1.5$ V, $I_{READ}$ is only a function of the charge (or equivalent voltage) on the floating-gate and can be set by an appropriate programming algorithm.

Figure 4B:
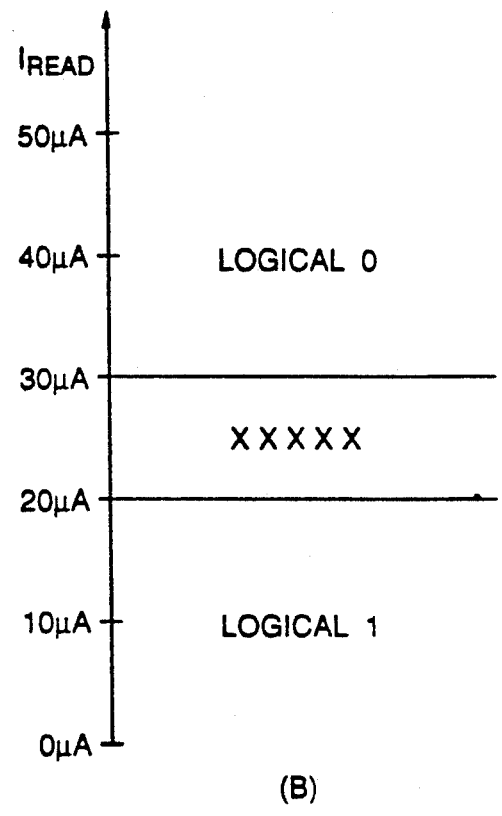
FIG. 4b is similar to FIG. 4a, but for a two state EEPROM cell.

After electrical erasure, all cells are distributed in the logical 0 state. The cells which are to store logical 1 state data will have to be programmed such that 30 μA $< I_{READ} < 20$ μA (FIG. 4a). This is in contrast to a two state EEPROM cell where the only requirement is to program the cell such that $I_{READ}$ is less than 20 μA (FIG. 4b). Because of the precision required in programming the cell into the logical 1 state, it is beneficial to have a very tight distribution of cells in the logical 0 state prior to programming.

In one embodiment of this invention, the recovery of overerased multi-state cells is performed unconditionally on many cells at once following erasure and prior to programming. This allows for a longer recovery time as opposed to the embodiment in which the recovery is done just before programming on a smaller number of cells (e.g. 100 as opposed to 2000), since programming time is generally viewed as more critical than erasure time. Because the recovery is done unconditionally on all cells, even those which will store logical 0's and 1's, $I_{READ}$ after this recovery step has to be greater than 40 μA in this example.

Specifically, the purpose of this recovery on a population of multi-state cells is to collapse the distribution of floating-gate voltages due to the erase operation such that cells with high floating-gate voltages (more overerased) will recover the most, the moderately overerased cells will recover a little less, and the just barely erased cells will not recover at all. In terms of $I_{READ}$ for this example, initially there is typically a distribution of $I_{READ}$ ranging from 40 to 65 μA. After the recovery, the distribution collapses to approximately 40 to 45 μA.

Table 3 shows the result of a 200 μsec recovery pulse at a drain voltage VD = 7 V, and a control gate voltage VCG = 2.5 V. The long recovery reduces $I_{READ}$ to below 20 μA. Since the unconditional recovery is applied to all cells, including the logical 0 and logical 1 state cells, this is clearly not acceptable, as the entire population of cells have been undesirably programmed almost to the logical 2 state. A shorter recovery time (10 sec) limits the recovery to above 40 μA; however, a relatively wide distribution of $I_{READ}$ still exists as shown in Table 4.

Figure 5:
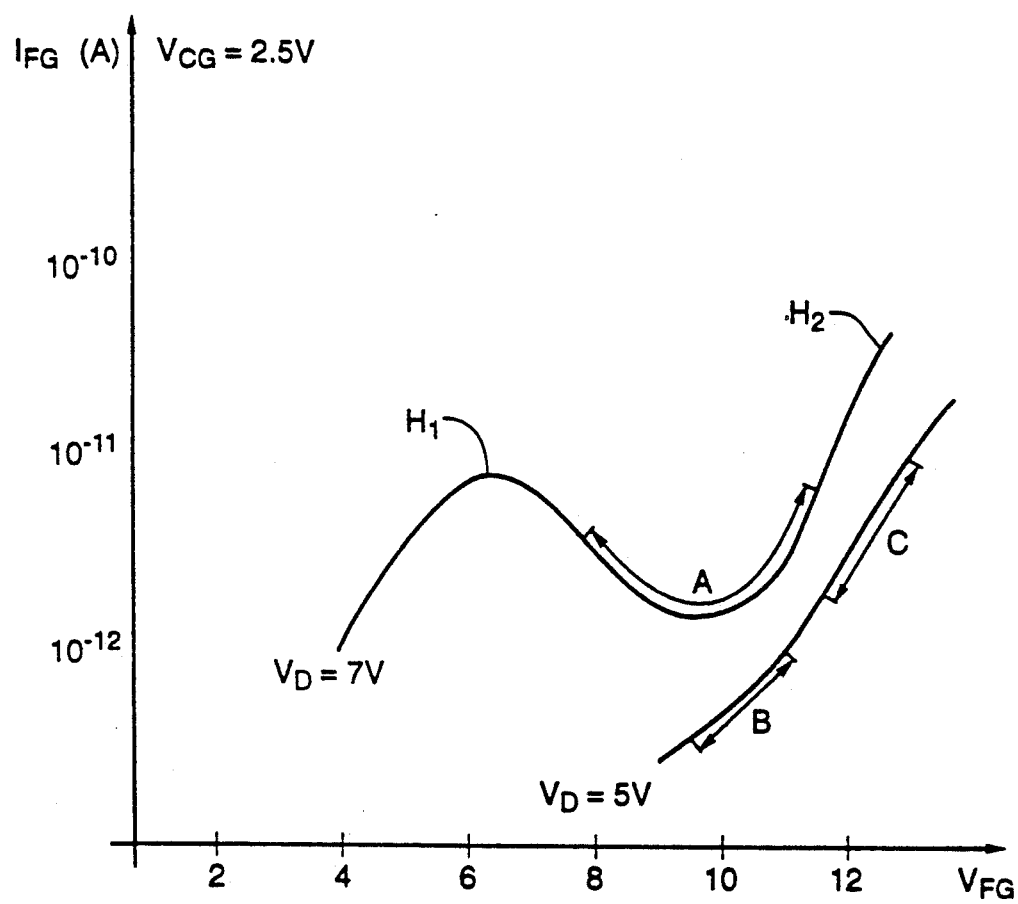
FIG. 5 depicts $I_{FG}$ vs. $V_{FG}$ characteristics for two different VD with VCG=2.5 V.

To achieve a much tighter distribution in $I_{READ}$ while maintaining the required logical 0 cell current (40 μA) level after recovery, a recovery at a lower drain voltage with the option of coupling a positive voltage to the floating-gate from an auxiliary electrode which capacitively couples to the floating gate (for example an erase gate) to further enhance the recovery is used in one embodiment of this invention. From Table 4, a recovery of 10 μsec at VD = 7V affects the just barely erased cells as much as the very overerased cells. This is due to the valley (region A) in the $I_{FG}$ vs. $V_{FG}$ curve as shown in FIG. 5. By reducing VD (for example to VD = 5 V), the first hump $H_1$ and valley A in the $I_{FG}$ vs. $V_{FG}$ curve is eliminated because this gate injection mechanism (drain hot carrier injection) requires a higher drain voltage (e.g., VD = 7 V). However, the second hump $H_2$ in the $I_{FG}$ vs. $V_{FG}$ curve is only slightly reduced because it does not require as high a drain voltage.

Region B shows the distribution of $V_{FG}$ at VD = 5 V as compared to VD = 7 V. To compensate for the lower $I_{FG}$ at VD = 5 V as compared to VD = 7 V, a longer recovery time is required. Table 5 shows the results for a 200 μsec recovery with VCG = 2.5 V, VD = 5 V, and 0 volts coupled from the erase gate. Of interest, the just barely erased cells do not recover at all, as desired. To further enhance the recovery of the very overerased cells, in one embodiment, $V_{FG}$ is coupled higher by applying a positive voltage to an auxiliary electrode, e.g., the erase gate (region C of FIG. 5) resulting in a larger $I_{FG}$. The recovery results for a positive voltage of 10 V coupled from the erase gate is shown in Table 6.

TABLE 3

| Recovery pulse: $V_D$ = 7V and $V_{CG}$ = 2.5V for 200 μsec | | |
|---|---|---|
| $I_{READ}$ after erase (μA) | $I_{READ}$ after recovery (μA) | Δ $I_{READ}$ (μA) |
| 41.3 | 10.9 | 30.4 |
| 50.8 | 11.9 | 38.9 |
| 54.9 | 13.7 | 41.2 |
| 59.4 | 15.1 | 44.3 |
| 61.9 | 15.4 | 46.5 |

TABLE 4

| Recovery pulse: $V_D$ = 7V and $V_{CG}$ = 2.5V for 10 μsec | | |
|---|---|---|
| $I_{READ}$ after erase (μA) | $I_{READ}$ after recovery (μA) | Δ $I_{READ}$ (μA) |
| 47.1 | 42.4 | 4.7 |
| 51.5 | 49.8 | 1.7 |

TABLE 4-continued

Recovery pulse: $V_D = 7V$ and $V_{CG} = 2.5V$ for 10 μsec

| $I_{READ}$ after erase (μA) | $I_{READ}$ after recovery (μA) | Δ $I_{READ}$ (μA) |
|---|---|---|
| 54.9 | 54.1 | 0.8 |
| 59.8 | 56.5 | 3.3 |
| 61.6 | 56.6 | 5.0 |

TABLE 5

Recovery pulse: $V_D = 5V$ and $V_{CG} = 2.5V$ for 200 μsec with $V_E = 0V$

| $I_{READ}$ after erase (μA) | $I_{READ}$ after recovery (μA) | Δ $I_{READ}$ (μA) |
|---|---|---|
| 46.1 | 46.0 | 0.1 |
| 51.9 | 51.9 | 0.0 |
| 56.0 | 54.8 | 1.2 |
| 60.3 | 55.3 | 5.0 |
| 61.6 | 55.3 | 6.3 |

TABLE 6

Recovery pulse: $V_D = 5V$ and $V_{CG} = 2.5V$ for 200 μsec with $V_E = 10V$

| $I_{READ}$ after erase (μA) | $I_{READ}$ after recovery (μA) | Δ $I_{READ}$ (μA) |
|---|---|---|
| 42.4 | 41.9 | 0.5 |
| 48.7 | 45.0 | 3.7 |
| 53.8 | 45.5 | 8.3 |
| 59.0 | 45.6 | 13.4 |
| 61.6 | 45.9 | 15.7 |

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method for operating an Electrically Erasable Programmable Read Only Memory (EEPROM) having a plurality of memory cells, each of said memory cells comprising a source, a drain, a channel region having a first and a second portion lying between said source and drain with said second portion adjacent said source and serving as the channel of a select transistor, a floating gate above said first portion of said channel region, and a control gate having a first portion above said floating gate and a second portion above said second portion of said channel region, comprising the steps of:
    erasing a plurality of said memory cells; and
    performing a recovery step by applying a potential voltage difference between said source and drain of sufficient magnitude for hot electron programming to occur, and a voltage approximately equal to the threshold voltage of said second portion of said channel region of said memory cells to said control gate, in which the floating gate voltages of said overerased cells are reduced while substantially not affecting the floating gate voltages of memory cells which are not overerased, whereby those of said plurality of said memory cells which have been overerased during said step of erasing are made to be less overerased in preparation for a subsequent programming step.

2. A method as in claim 1 wherein said recovery step comprises the step of causing a floating gate current to flow in said overerased memory cells, while causing a floating gate current to flow in those memory cells which are not overerased which is significantly less than the floating gate current in said overerased memory cells.

3. A method as in claim 2 wherein said floating gate current during recovery is greater for cells which are more overerased during recovery for cells which are less overerased.

4. A method as in claim 1 wherein said step of recovery is performed utilizing a relatively high drain voltage within the range of approximately 6 to 9 volts.

5. A method as in claim 1 wherein said step of recovery is performed utilizing a relatively low drain voltage within the range of approximately 4 to 6 volts in order to reduce drain hot carrier injection.

6. A method as in claim 4 wherein said subsequent programming step is performed utilizing a relatively high drain voltage within the range of approximately 6 to 9 volts and a relatively high control gate voltage within the range of approximately 8 to 12 volts.

7. A method as in claim 5 wherein said subsequent programming step is performed utilizing a relatively high drain voltage within the range of approximately 6 to 9 volts and a relatively high control gate voltage within the range of approximately 8 to 12 volts.

8. A method as in claim 4 wherein said step of recovery further utilizes a positive voltage coupled to said floating gate.

9. A method as in claim 8 wherein said positive voltage is coupled to said floating gate through an erase gate.

10. A method as in claim 5 wherein said step of recovery further utilizes a positive voltage coupled to said floating gate.

11. A method as in claim 10 wherein said positive voltage is coupled to said floating gate through an erase gate.

12. A method as in claim 1 wherein said step of recovery further utilizes a positive voltage coupled to said floating gate.

13. A method as in claim 12 wherein said positive voltage is coupled to said floating gate through an erase gate.

14. A method for operating an EEPROM comprising a plurality of memory cells which in turn comprise a first plurality of overerased memory cells and a second plurality of non-overerased memory cells, each of said memory cells comprising a source, a drain, a channel region having a first and a second portion lying between said source and drain with said second portion adjacent said source and serving as the channel of a select transistor, a floating gate above said first portion of said channel region, and a control gate having a first portion above said floating gate and a second portion above said second portion of said channel region, comprising the steps of:
    performing a recovery step to cause said first plurality of overerased memory cells to become less overerased by applying a potential voltage difference between said source and drain of sufficient magnitude for hot electron programming to occur, and a voltage approximately equal to the threshold voltage of said second portion of said channel region of said memory cells to said control gate, in which the floating gate voltages of said overerased cells are reduced while substantially not affecting the floating gate voltages of memory cells which are not overerased; and programming said first and second plurality of memory cells.

15. A method as in claim 14 wherein said recovery step comprises the step of causing a floating gate current to flow in said overerased memory cells, while causing a floating gate current to flow in those memory cells which are not overerased which is significantly less than the floating gate current in said overerased memory cells.

16. A method as in claim 15 wherein said floating gate current during recovery is greater for cells which are more overerased than said floating gate current during recovery for cells which are less overerased.

17. A method as in claim 14 wherein said step of recovery is performed utilizing a relatively high drain voltage within the range of approximately 6 to 9 volts.

18. A method as in claim 14 wherein said step of recovery is performed utilizing a relatively low drain voltage within the range of approximately 4 to 6 volts in order to reduce drain hot carrier injection.

19. A method as in claim 17 wherein said subsequent programming step is performed utilizing a relatively high drain voltage within the range of approximately 6 to 9 volts and a relatively high control gate voltage within the range of approximately 8 to 12 volts.

20. A method as in claim 18 wherein said subsequent programming step is performed utilizing a relatively high drain voltage within the range of approximately 6 to 9 volts and a relatively high control gate voltage within the range of approximately 8 to 12 volts.

21. A method as in claim 17 wherein said step of recovery further utilizes a positive voltage coupled to said floating gate.

22. A method as in claim 21 wherein said positive voltage is coupled to said floating gate through an erase gate.

23. A method as in claim 18 wherein said sep of recovery further utilizes a positive voltage coupled to said floating gate.

24. A method as in claim 23 wherein said positive voltage is coupled to said floating gate through an erase gate.

25. A method as in claim 14 wherein said step of recovery further utilizes a positive voltage coupled to said floating gate.

26. A method as in claim 25 wherein said positive voltage is coupled to said floating gate through an erase gate.

* * * * *